United States Patent
Hackett

(10) Patent No.: US 9,470,726 B2
(45) Date of Patent: Oct. 18, 2016

(54) TEMPERATURE COMPENSATED REAL-TIME CLOCK

(71) Applicant: Maxim Integrated Products, Inc., San Jose, CA (US)

(72) Inventor: Nathan Theodore Hackett, Corona, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 0 days.

(21) Appl. No.: 14/671,908

(22) Filed: Mar. 27, 2015

(65) Prior Publication Data

US 2016/0116515 A1   Apr. 28, 2016

Related U.S. Application Data

(60) Provisional application No. 62/069,170, filed on Oct. 27, 2014.

(51) Int. Cl.
| | |
|---|---|
| *H03L 1/00* | (2006.01) |
| *G01R 22/04* | (2006.01) |
| *H03B 5/36* | (2006.01) |
| *H03L 1/02* | (2006.01) |
| *H04L 27/233* | (2006.01) |

(52) U.S. Cl.
CPC ............. *G01R 22/04* (2013.01); *H03B 5/36* (2013.01); *H03L 1/026* (2013.01); *H04L 27/2338* (2013.01)

(58) Field of Classification Search
CPC ....... H03B 5/36; H04L 27/2338; H03L 7/00; G01R 22/04
USPC ................. 331/158, 116 FE, 116 R, 176
See application file for complete search history.

(56) References Cited

U.S. PATENT DOCUMENTS

2007/0057737 A1* 3/2007 Davis .................. H03C 3/0933
331/17

* cited by examiner

*Primary Examiner* — Arnold Kinkead
(74) *Attorney, Agent, or Firm* — Robert Crownover

(57) ABSTRACT

Systems and methods of a temperature compensated real-time clock are disclosed. The systems and methods can include measuring a temperature with a temperature sensor, detecting a temperature dependent frequency from an oscillator, inputting the temperature and determining a temperature estimate for the oscillator with an infinite impulse response filter, and determining a compensation factor, for the oscillator.

18 Claims, 3 Drawing Sheets

TEMPERATURE COMPENSATED REAL-TIME CLOCK

CROSS-REFERENCE TO RELATED APPLICATIONS

This claims priority benefit to all common subject matter of U.S. Provisional Patent Application No. 62/069,170 filed Oct. 27, 2014; the content of which is incorporated herein by reference.

TECHNICAL FIELD

This disclosure relates to real-time clocks, more particularly to real-time clocks with crystal oscillator temperature compensation.

BACKGROUND

The sophistication and complexity of the electrical power grid has grown to include electricity meters that incorporate timing functions for billing metrics. Timing functions provide greater precision for consumers and providers by allowing increased ability to manage costs. For example, timing functionality is useful in "time-of-use" metering where the rate for energy can change depending on the time of day the energy is used.

Meters employing time-of-use metering employ a real time clock that is often based on a precision timing crystal. In some applications the precision timing crystal is a tuning fork style quartz crystal oscillator. The frequency of this crystal oscillator is a function of temperature. A temperature sensor is sometimes used to determine a correction factor for keeping the real time clock accurate.

Temperature readings from these sensors, however, do not directly measure the temperature of the crystal oscillator, and correction factors based on these measurements can be inaccurate and introduce compensation errors. There are industry standards for accuracy of the real time clock in utility meters. In particular, ANSI C12.1-2001 requirements for real time clock accuracy are two minutes per week or 200 ppm over a temperature range of 30° C. to 70° C. Some utilities require greater accuracies such as one minute per month or 23 ppm at temperatures of 30° C. and 40° C.

As industry standards for clock accuracy and variation across temperature become increasingly tighter, real time clock accuracy becomes an ever more important competitive feature and market differentiator for electric meter real time clocks. Previous solutions, that attempted to provide greater accuracy in identifying accurate correction factors, include adding a time delay to the temperature measurement before it is used to compensate the real time clock. Adding a time delay can provide a more accurate correction factor than an uncompensated temperature measurement; however, a time delay is an incomplete solution as it introduces compensation errors when ambient temperature shifts are rapid.

Solutions have been long sought but prior developments have not taught or suggested any complete solutions, and solutions to these problems have long eluded those skilled in the art. Thus there remains a considerable need for devices and methods that can provide accurate temperature correction factors for real time clocks.

SUMMARY

A temperature compensated real-time clock providing significantly increased accuracy is disclosed along with methods of manufacture, operation, and implementation. The temperature compensated real-time clock can include: measuring a temperature with a temperature sensor; detecting a temperature dependent frequency from an oscillator; inputting the temperature and determining a temperature estimate for the oscillator with an infinite impulse response filter; and determining a compensation factor, for the oscillator.

It is disclosed that determining the temperature estimate for the oscillator with the infinite impulse response filter includes determining the temperature estimate for the oscillator with the infinite impulse response filter performing a transfer function for the temperature estimate as a function of the temperature and treating the oscillator as a first thermal mass on a first thermal gradient and treating the temperature sensor as a second thermal mass on a second thermal gradient.

It is disclosed that detecting the temperature dependent frequency can include detecting the temperature dependent frequency with: a crystal oscillator; a tuning fork style quartz crystal oscillator; or an oscillator operating in the 32 KHz range.

It is disclosed that determining the temperature estimate for the oscillator includes: assuming the first thermal gradient and the first thermal mass are exposed to the same ambient temperature; assuming the second thermal gradient and the second thermal mass are exposed to the same ambient temperature; or a combination thereof.

It is disclosed that determining the temperature estimate for the oscillator includes: assuming that the first thermal gradient is not the same as the second thermal gradient; assuming that the first thermal mass is not the same as the second thermal mass; or a combination thereof.

It is disclosed measuring the temperature is measured with discrete samples of the temperature sensor and that determining the temperature estimate is based on the discrete samples of the temperature sensor.

It is further disclosed that methods of operation, and implementation of the temperature compensated real-time clock can include adjusting the real-time clock based on the compensation factor, adjusting the oscillator's load capacitance based on the compensation factor, or a combination thereof. It is disclosed that adjusting the real-time clock can include adjusting registers within the real-time clock, or adjusting the frequency recorded by the real-time clock.

It is disclosed that determining a compensation factor, with digital logic for the oscillator can include determining the compensation factor from a table correlating a frequency of the oscillator with a temperature of the oscillator, from an equation describing the compensation factor as a function of the temperature of the oscillator, or a combination thereof.

It is further disclosed that methods of manufacture, operation, and implementation of the temperature compensated real-time clock can include incorporating the temperature sensor, the real-time clock, the digital logic, the infinite impulse response filter within a system on a chip; and coupling the oscillator to the system on a chip, the oscillator contained in a separate vacuum sealed package.

It is further disclosed that methods of manufacture, operation, and implementation of the temperature compensated real-time clock can include coupling the system on a chip incorporating the real-time clock to remote sensors for measuring electricity usage and providing a time of day for the electricity usage based on the temperature compensated real-time clock. It is disclosed that the remote sensors can be a current transformer, shunt, Rogowski coil, or a combination thereof.

Other contemplated embodiments can include objects, features, aspects, and advantages in addition to or in place of those mentioned above. These objects, features, aspects, and advantages of the embodiments will become more apparent from the following detailed description, along with the accompanying drawings.

BRIEF DESCRIPTION OF THE DRAWINGS

The temperature compensated real-time clock is illustrated in the figures of the accompanying drawings which are meant to be exemplary and not limiting, in which like reference numerals are intended to refer to like components, and in which.

DETAILED DESCRIPTION

Figure 1:
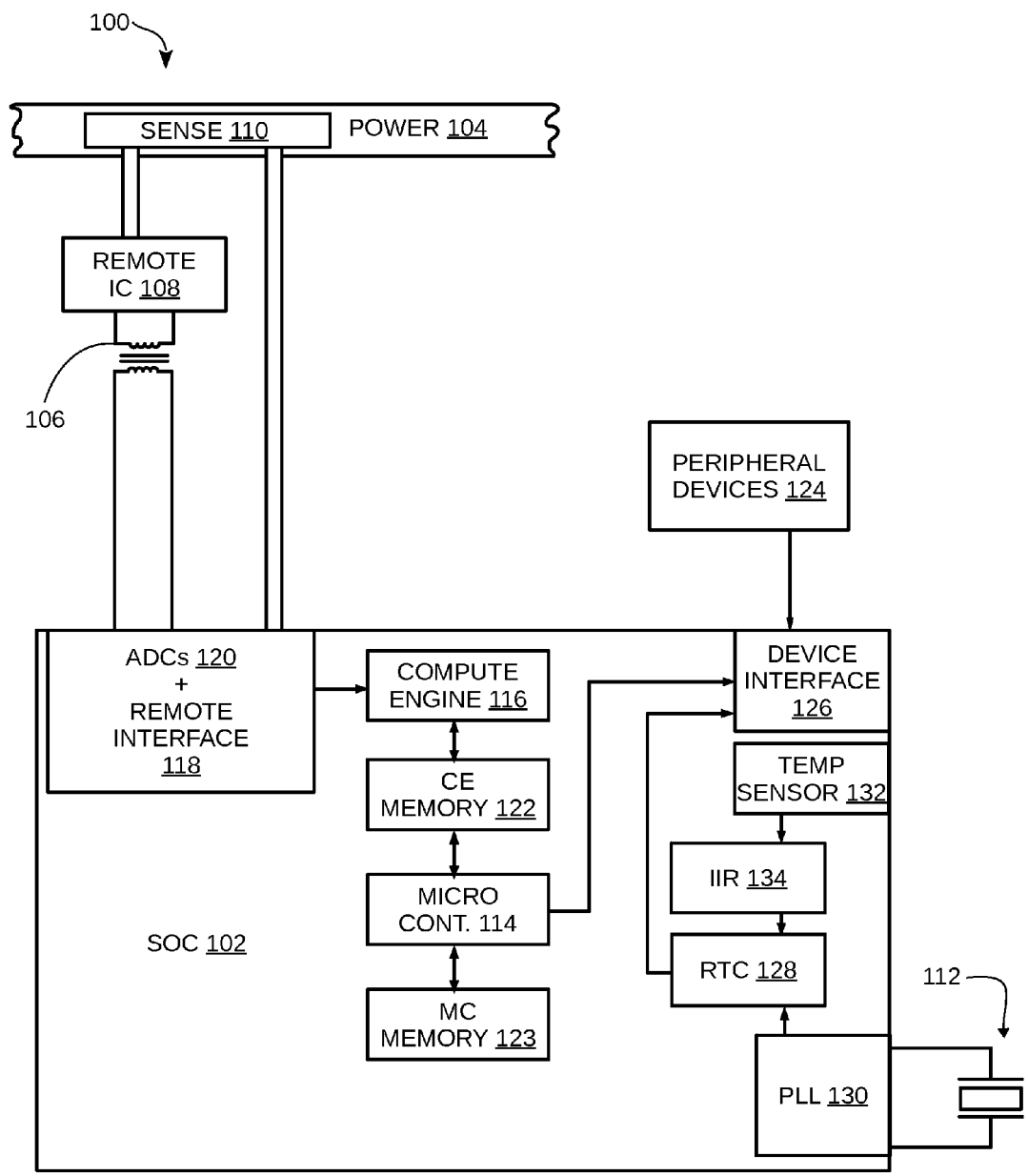
FIG. 1 is a block diagram of an embodiment of the temperature compensated real-time clock.

In the following description, reference is made to the accompanying drawings that form a part hereof, and in which are shown by way of illustration, embodiments in which the temperature compensated real-time clock may be practiced. It is to be understood that other embodiments may be utilized and structural changes may be made without departing from the scope of the temperature compensated real-time clock.

The temperature compensated real-time clock is described in sufficient detail to enable those skilled in the art to make and use the temperature compensated real-time clock and provide numerous specific details to give a thorough understanding of the temperature compensated real-time clock; however, it will be apparent that the temperature compensated real-time clock may be practiced without these specific details.

In order to avoid obscuring the temperature compensated real-time clock, some well-known system configurations are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Referring now to FIG. 1, therein is shown a block diagram of an embodiment of the temperature compensated real-time clock 100. The temperature compensated real-time clock 100 is shown having a system on a chip (SOC 102), coupled to a power transmission line 104. The SOC 102 can further be coupled to a pulse transformer 106 and to a remote IC 108 for isolating remote sensors 110 from the SOC 102 that are monitoring the power transmission line 104. Further, the SOC 102 includes a crystal oscillator 112 coupled thereto.

The SOC 102 can be a single-phase electricity meter that incorporates a microcontroller core 114, a compute engine (CE 116), and remote interfaces 118. The remote interfaces 118 can couple the remote sensors 110 to the SOC 102 through the remote IC 108.

The SOC 102 can further include analog to digital converters (ADCs 120), such as delta-sigma ADCs, for measuring current channels and voltage channels. The CE 116 can be a fixed-point compute engine and can processes the ADCs 120 samples.

The code for the CE 116 resides in CE memory 122 and can be shared with the microcontroller core 114. The microcontroller core 114 is further depicted having dedicated microcontroller memory 123.

The ADCs 120 can be configured to monitor environmental signals including magnetic fields, or varying AC fields induced by nearby power lines or the power transmission line 104. The remote interfaces 118 may support channels assigned to measure line voltage, line current, and neutral current, plus any other analog signal of interest. It is contemplated that the remote interfaces 118 can be self-contained and provide inherent isolation to protect the SOC 102 from the power transmission line 104 potentials. The remote sensors 110 that can be connected to the SOC 102, via the remote interfaces 118, can include current transformers, shunts, or Rogowski coils.

The CE 116 of the SOC 102 can be used to process metrology samples from the remote interfaces 118 and perform calculations on the measurements, for example, real energy and reactive energy, as well as volt-ampere hours for four-quadrant metering. The measurements from the CE 116 can be accessed by the microcontroller core 114, processed further, and output to peripheral devices 124 available to the microcontroller core 114 and coupled to the SOC 102 through device interfaces 126. Peripheral devices 124 coupled to the SOC 102 through the device interface 126 can include serial memory devices and complex display subsystems.

The SOC 102 can further include a real-time clock (RTC 128) to record time-of-use metering information for multi-rate applications. The RTC 128 can provide a time-stamp for the measurements or other events including tamper events. The RTC 128 can use the crystal oscillator 112, coupled to the SOC 102, as a frequency reference. The crystal oscillator 112 can provide a temperature dependent frequency.

The crystal oscillator 112 can be, for example, a tuning-fork-type crystal oscillator 112. The crystal oscillator 112 is typically contained within a vacuum sealed package external to the SOC 102. The frequency supplied by the crystal oscillator 112 to the SOC 102 can be multiplied with a phase-locked loop 130 to provide clocking for the CE 116 and the microcontroller core 114 along with other clocks required by the SOC 102.

The SOC 102 can further include temperature compensation components. The temperature compensation components can include a temperature sensor 132, which allows for a temperature-correction mechanism that can guarantee conformance to accuracy standards over temperature. The temperature compensation components implemented in the present depiction of the temperature compensated real-time clock can further include an infinite impulse response filter 134. As used herein the infinite impulse response filter 134 is defined as an impulse response filter including feedback.

The infinite impulse response filter 134 can be used to estimate the actual temperature of the crystal oscillator 112 based on input from the temperature sensor 132 and thermal models of the temperature sensor 132 and the crystal oscillator 112, as discussed in further detail below. The RTC 128 can be adjusted based on the infinite impulse response filter 134 estimate and the time of day can be output through the device interfaces 126.

The infinite impulse response filter 134 is depicted as an independent functional block implemented in digital logic; however, it is contemplated that the infinite impulse response filter 134 could be software or firmware for example running on the microcontroller core 114. It is contemplated that the infinite impulse response filter 134 is implemented in digital logic whether as an independent functional block or as implemented with software or firmware in the digital logic of a processor such as the microcontroller core 114.

In the present embodiment of the temperature compensated real-time clock 100, the temperature sensor 132 is much more responsive to ambient temperature than the crystal oscillator 112, due to the crystal oscillator's 112 isolation within a vacuum sealed package. It has been discovered that the infinite impulse response filter 134 can be implemented to provide an exceedingly accurate model of the actual temperature of the crystal oscillator 112 based on the temperature sensor's 132 measurements. The RTC 128 can then be adjusted or compensated without adjustment and compensation errors allowing the temperature compensated real-time clock 100 to meet stringent governmental regulations and provide greater accuracy in a highly competitive market.

Figure 2:
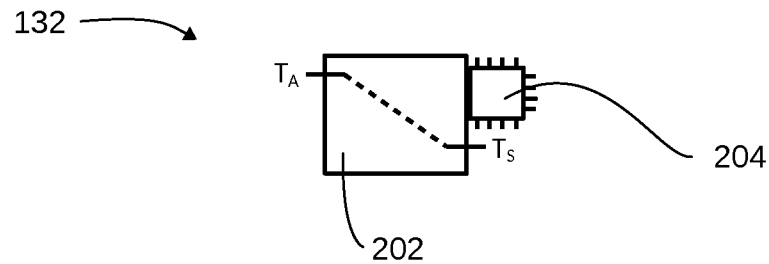
FIG. 2 is a thermal model of the temperature sensor of FIG. 1.

Referring now to FIG. 2, therein is shown a thermal model of the temperature sensor 132 of FIG. 1. The thermal model can include a thermal gradient model 202 and a thermal mass model 204 coupled to the end of the thermal gradient 202.

The thermal model of the temperature sensor 132 is shown with an ambient temperature $T_A$ at one end of the thermal gradient model 202 opposite from the thermal mass model 204. The thermal model of the temperature sensor 132 is further shown with a sensor temperature $T_S$ at a different end of the thermal gradient model 202 near the thermal mass model 204.

The thermal gradient model 202 can be described using the one-dimensional form of Fourier's law of thermal conduction given by Equation 1:

$$q = -K \frac{dT}{dx} \qquad \text{Equation 1}$$

Here, q is the local heat flux density equivalent to the heat per unit area, and its vector. K is the material's thermal conductivity. dT/dx is the thermal gradient in the direction of the flow. The thermal mass model 204 can be approximated by an equation assuming a uniform composition given by Equation 2:

$$q = mC_p \frac{dT}{dt} \qquad \text{Equation 2}$$

Here, m is the mass of the body and $C_p$ is the isobaric specific heat capacity of the material averaged over the relevant temperature range. For bodies composed of numerous different materials, the thermal masses for the different components can be added together. The steady state heat transfer through the thermal gradient model 202 and the thermal mass model 204 can be described by Equation 3:

$$-\frac{K}{d}[T - T_A] = mC_p \frac{dT}{dt} \qquad \text{Equation 3}$$

Equation 3 can be rewritten as:

$$T_A - T = \frac{mC_p d}{K} \frac{dT}{dt} \qquad \text{Equation 4}$$

The resulting ordinary first order differential equation is:

$$\frac{T_A}{\alpha} - \frac{T}{\alpha} = T' \qquad \text{Equation 5}$$

Here, α represents thermal diffusivity divided by the distance over which the heat has to diffuse. Thermal diffusivity is the thermal conductivity divided by mass and specific heat capacity. It is contemplated that α can represent a composite value derived from the various different materials actually involved in the real system, not just in terms of thermal mass but also thermal conductivity and material thicknesses. Equation 5 rewritten specifically to describe the temperature sensor 132 is:

$$T'_S = \frac{T_A}{\alpha_S} - \frac{T_S}{\alpha_S} \qquad \text{Equation 6}$$

Figure 3:
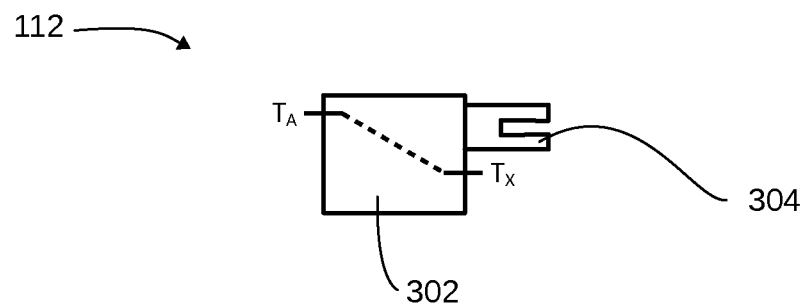
FIG. 3 is a thermal model of the crystal oscillator of FIG. 1.

Referring now to FIG. 3, therein is shown a thermal model of the crystal oscillator 112 of FIG. 1. The thermal model can include a thermal gradient model 302 and a thermal mass model 304 coupled to the end of the thermal gradient model 302.

The thermal model of the crystal oscillator 112 is shown with an ambient temperature $T_A$ at one end of the thermal gradient model 302 opposite from the thermal mass model 304. The thermal model of the crystal oscillator 112 is further shown with a crystal temperature $T_X$ at a different end of the thermal gradient model 302 near the thermal mass model 304.

The thermal gradient model 302 and the thermal mass model 304 can be described using Equation 1 and Equation 2, respectively. Equation 1 and Equation 2 assume that both the thermal gradient model 202 for the temperature sensor 132 of FIG. 1 and the thermal gradient model 302 for the crystal oscillator 112 are exposed to the same ambient temperature $T_A$. The resulting ordinary first order differential equation describing the heat transfer through the thermal gradient model 302 and the thermal mass model 304 of the crystal oscillator 112 is:

$$T'_X = \frac{T_A}{\alpha_X} - \frac{T_X}{\alpha_X} \qquad \text{Equation 7}$$

Although the thermal gradient model 302 and the thermal mass model 304 of the crystal oscillator 112, and the thermal gradient model 202 and the thermal mass model 204 of the temperature sensor 132, are described as ordinary first order differential equations using only a single thermal mass and thermal gradient for either the temperature sensor 132 or the crystal oscillator 112, it is contemplated that the thermal models could include multiple gradients and masses having unique properties. Further it is contemplated that the thermal models could be described as higher order differential equations.

It has been discovered that using Equations 6 and 7 to model potentially different thermal conductivity through the thermal gradient model 202 of the temperature sensor 132 and the thermal gradient model 302 of the crystal oscillator 112 provide a much more accurate estimate of the actual temperature of the crystal oscillator 112 and allow for more precise compensation or adjustments. Further, it has been discovered that using Equations 6 and 7 to model potentially different thermal masses with the thermal mass model 204 and the thermal mass model 304 further enhance the accuracy of the temperature estimate of the crystal oscillator 112 allow for even more precise compensation or adjustments.

Figure 4:
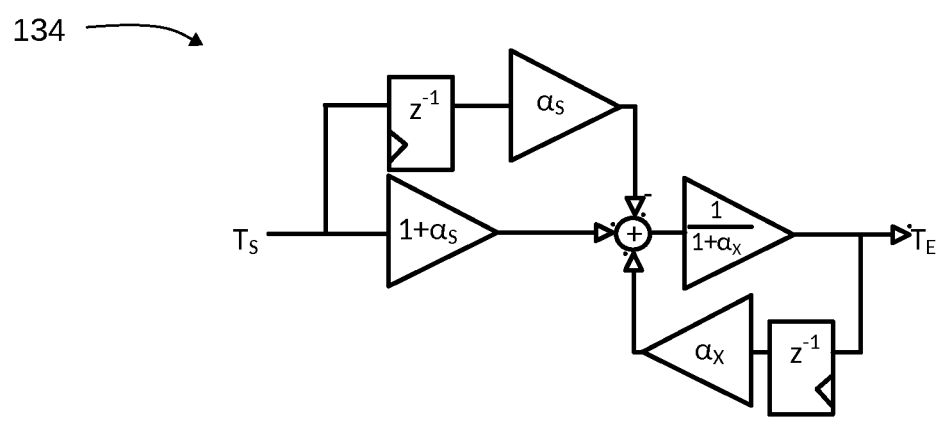
FIG. 4 is a schematic view of the infinite impulse response filter of FIG. 1.

Referring now to FIG. 4, therein is shown a schematic view of the infinite impulse response filter 134 of FIG. 1. The infinite impulse response filter 134 can be designed by determining a transfer function for the crystal temperature as a function of the chip temperature.

First, the ordinary first order differential equations for the temperature sensor 132 and the crystal oscillator 112 are solved for the crystal temperature $T_X$ using the Laplace method:

$$[T_X] = \frac{1 + \alpha_S S}{1 + \alpha_X S} [T_S] \qquad \text{Equation 8}$$

The continuous time transfer function H(s) mapping the Laplace transform of the input to the Laplace transform of the output for converting sensor temperature into crystal temperature is:

$$H(S) = \frac{1 + \alpha_S S}{1 + \alpha_X S} \qquad \text{Equaiton 9}$$

A discrete time transfer function can be derived from the continuous time transfer function using the z-transform providing:

$$H[z] = \frac{1 + \alpha_S - \alpha_S z^{-1}}{1 + \alpha_X - \alpha_X z^{-1}} \qquad \text{Equation 10}$$

A difference equation can be derived from the discrete time transfer function:

$$T_E = T_X[n] = \left(\frac{1}{1+\alpha_X}\right)((1+\alpha_S)T_S[n] - \alpha_S T_S[n-1] + \alpha_X T_X[n-1]) \qquad \text{Equation 11}$$

The infinite impulse response filter 134 is described by Equation 11. The delays of Equation 11, or the (n-1) are shown by the delay block $z^{-1}$. The operations on the thermal diffusivity of both the temperature sensor 132 and the crystal oscillator 112 are also shown.

The output of the infinite impulse response filter 134 is an estimated temperature $T_E$ of the crystal oscillator 112. It has been discovered that implementing the infinite impulse response filter 134 provides exceptional speed for providing the estimated temperature $T_E$ of the crystal oscillator 112 based on the sensor temperature $T_S$ of the temperature sensor 132.

Figure 5:
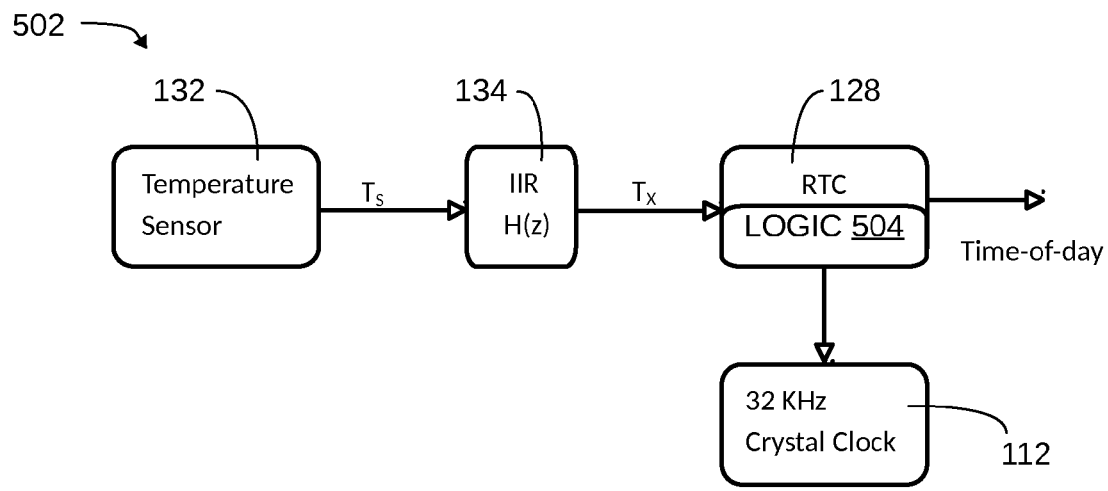
FIG. 5 is a block diagram of temperature compensation components of FIG. 1.

Referring now to FIG. 5, therein is shown a block diagram of temperature compensation components 502 for the real-time clock 128 of FIG. 1. The temperature compensation components 502 can include the temperature sensor 132, the infinite impulse response filter 134, the RTC 128, and the crystal oscillator 112.

The crystal oscillator 112 of the temperature compensation components 502 is shown with the crystal oscillator 112 operating at 32 KHz. The crystal oscillator's 112 frequency can be compensated based on the temperature estimate $T_E$ of the actual crystal temperature $T_S$ using the infinite impulse response filter 134.

The resultant temperature estimate $T_E$ from the infinite impulse response filter 134 has been discovered to be highly accurate. The estimated temperature $T_E$ from the infinite impulse response filter 134 can be fed into RTC calibration logic 504 residing within the RTC 128.

The RTC calibration logic 504 can correlate the estimated temperature from the infinite impulse response filter 134 with compensation factor from a correlation table for the crystal oscillator 112. The RTC calibration logic 504 can further calculate the compensation factor based on the estimated temperature $T_E$ from the infinite impulse response filter 134 using an equation. The frequency from the crystal oscillator 112 can then be recorded by registers within the RTC 128 at a modified or augmented rate as the RTC logic 504 digitally adjusts the way the frequency of the crystal oscillator 112 is recorded by registers within the RTC 128.

Adjusting the recording of the crystal oscillator's 112 frequency based on the accurate temperature estimate $T_E$ of the infinite impulse response filter 134 allows the RTC 128 to provide a highly accurate account of the time of day. It is contemplated that an adjustment mechanism that adjusts the frequency of the crystal oscillator 112 can also be used, such as adjusting the crystal oscillator's 112 load capacitance.

Figure 6:
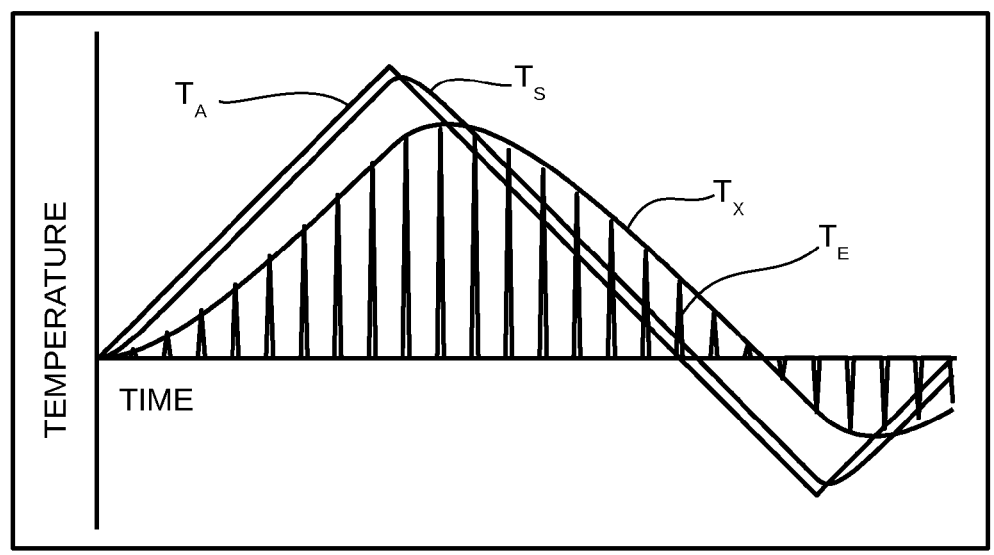
FIG. 6 is a temperature chart for the temperature compensated real-time clock of FIG. 1.

Referring now to FIG. 6, therein is shown a temperature chart for the temperature compensated real-time clock 100 of FIG. 1. The temperature chart is shown depicting the performance of the infinite impulse response filter 134. The Y-axis is temperature, the X-axis is time, the $T_A$ trace is the ambient temperature, the $T_S$ trace is the sensor temperature, the $T_X$ trace is the crystal temperature and the $T_E$ trace is the estimated crystal temperature based on discrete samples of the sensor temperature.

Thus, it has been discovered that the temperature compensated real-time clock furnishes important and heretofore unknown and unavailable solutions, capabilities, and functional aspects. The resulting configurations are straightforward, cost-effective, uncomplicated, highly versatile, accurate, sensitive, and effective, and can be implemented by adapting known components for ready, efficient, and economical manufacturing, application, and utilization.

While the temperature compensated real-time clock has been described in conjunction with a specific best mode, it is to be understood that many alternatives, modifications, and variations will be apparent to those skilled in the art in light of the preceding description. Accordingly, it is intended to embrace all such alternatives, modifications, and variations, which fall within the scope of the included claims. All matters set forth herein or shown in the accompanying drawings are to be interpreted in an illustrative and non-limiting sense.

What is claimed is:

1. A method of real-time clock compensation comprising:
   measuring a temperature with a temperature sensor;
   detecting a temperature dependent frequency from an oscillator;

inputting the temperature and determining a temperature estimate for the oscillator with an infinite impulse response filter, and determining the temperature estimate includes performing a transfer function with the infinite impulse response filter for the temperature estimate as a function of the temperature and treating the oscillator as a first thermal mass on a first thermal gradient and treating the temperature sensor as a second thermal mass on a second thermal gradient; and determining a compensation factor, for the oscillator.

2. The method of claim 1 wherein determining the temperature estimate includes assuming the first thermal gradient and the first thermal mass are exposed to the same ambient temperature, assuming the second thermal gradient and the second thermal mass are exposed to the same ambient temperature, or assuming a combination thereof.

3. The method of claim 1 wherein determining the temperature estimate for the oscillator includes assuming that the first thermal gradient is not the same as the second thermal gradient, assuming that the first thermal mass is not the same as the second thermal mass, or assuming a combination thereof.

4. The method of claim 1 wherein detecting the temperature dependent frequency includes detecting the temperature dependent frequency with a crystal oscillator, a tuning fork style quartz crystal oscillator, or an oscillator operating in the 32 KHz range.

5. The method of claim 1 wherein:
measuring the temperature includes measuring the temperature with discrete samples of the temperature sensor; and
determining the temperature estimate includes determining the temperature estimate based on the discrete samples of the temperature sensor.

6. The method of claim 1 further comprising adjusting a real-time clock based on the compensation factor, adjusting the oscillator's load capacitance based on the compensation factor, or a combination thereof.

7. The method of claim 6 wherein adjusting the real-time clock includes adjusting registers within the real-time clock, adjusting a frequency recorded by the real-time clock, or a combination thereof.

8. The method of claim 1 further comprising coupling a system on a chip incorporating a real-time clock to a remote sensor for measuring electricity usage and providing a time of day for the electricity usage based on the real-time clock.

9. The method of claim 8 wherein coupling the system on a chip to the remote sensor includes coupling the system on a chip to a current transformer, shunt, Rogowski coil, or a combination thereof.

10. A temperature compensated system comprising:
a temperature sensor configured to measure a temperature;
an oscillator configured to detect a temperature dependent frequency;
an infinite impulse response filter configured to determine a temperature estimate for the oscillator from the temperature with a transfer function for the temperature estimate as a function of the temperature and the oscillator treated as a first thermal mass on a first thermal gradient and the temperature sensor treated as a second thermal mass on a second thermal gradient; and
digital logic configured to determine a compensation factor for the oscillator.

11. The system of claim 10 wherein the infinite impulse response filter is configured to determine the temperature estimate with the first thermal gradient and the first thermal mass assumed to be exposed to the same ambient temperature, the second thermal gradient and the second thermal mass assumed to be exposed to the same ambient temperature, or a combination thereof.

12. The system of claim 10 wherein the infinite impulse response filter is configured to determine the temperature estimate based on the first thermal gradient assumed not to be the same as the second thermal gradient, based on the first thermal mass assumed not to be the same as the second thermal mass, or a combination thereof.

13. The system of claim 10 wherein the oscillator is a crystal oscillator, a tuning fork style quartz crystal oscillator, or an oscillator operated in the 32 KHz range.

14. The system of claim 10 wherein:
the temperature sensor is configured to measure the temperature with discrete samples; and
the infinite impulse response filter is configured to determine the temperature estimate based on the discrete samples.

15. The system of claim 10 further comprising a real-time clock configured to be adjusted based on the compensation factor, a load capacitance of the oscillator is configured to be adjusted based on the compensation factor, or a combination thereof.

16. The system of claim 15 wherein the real-time clock is configured to be adjusted by registers adjusted within the real-time clock, an adjusted frequency recorded by the real-time clock, or a combination thereof.

17. The system of claim 10 further comprising a system on a chip having a real-time clock coupled to a remote sensor for measuring electricity usage and providing a time of day for the electricity usage based on the real-time clock.

18. The system of claim 17 wherein the system on a chip is coupled to a current transformer, shunt, Rogowski coil, or a combination thereof.

* * * * *